(12) United States Patent
Dyer et al.

(10) Patent No.: US 7,482,215 B2
(45) Date of Patent: Jan. 27, 2009

(54) SELF-ALIGNED DUAL SEGMENT LINER AND METHOD OF MANUFACTURING THE SAME

(75) Inventors: Thomas W. Dyer, Pleasant Valley, NY (US); Sunfei Fang, LaGrangeville, NY (US); Jiang Yan, Newburgh, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 196 days.

(21) Appl. No.: 11/468,536

(22) Filed: Aug. 30, 2006

(65) Prior Publication Data

US 2008/0054413 A1    Mar. 6, 2008

(51) Int. Cl.
*H01L 21/8238* (2006.01)
*H01L 21/302* (2006.01)
*H01L 21/461* (2006.01)
*H01L 21/31* (2006.01)
*H01L 21/469* (2006.01)

(52) U.S. Cl. .................. 438/199; 438/712; 438/760; 438/763

(58) Field of Classification Search .......... 438/712, 438/714, 763, 760, 635, 638, 640, 618, 624, 438/626, 199
See application file for complete search history.

(56) References Cited

U.S. PATENT DOCUMENTS

| | | |
|---|---|---|
| 4,732,871 A | 3/1988 | Buchmann et al. |
| 4,880,684 A | 11/1989 | Boss et al. |
| 4,958,213 A | 9/1990 | Eklund et al. |
| 5,134,085 A | 7/1992 | Gilgen et al. |
| 5,221,637 A | 6/1993 | De Boeck |
| 5,516,721 A | 5/1996 | Galli et al. |
| 5,559,357 A | 9/1996 | Krivokapic |
| 5,571,738 A | 11/1996 | Krivokapic |
| 5,920,780 A | 7/1999 | Wu |
| 5,981,383 A | 11/1999 | Lur et al. |
| 6,040,223 A | 3/2000 | Liu et al. |
| 6,316,349 B1 | 11/2001 | Kim et al. |
| 6,366,468 B1 | 4/2002 | Pan |
| 6,704,185 B2 | 3/2004 | Chatzandroulis et al. |
| 6,849,502 B2 | 2/2005 | Sasago et al. |
| 7,101,744 B1 | 9/2006 | Dyer et al. |

*Primary Examiner*—Ha Tran T Nguyen
*Assistant Examiner*—Valerie Brown
(74) *Attorney, Agent, or Firm*—Yuanmin Cai

(57) ABSTRACT

A method of forming a dual segment liner covering a first and a second set of semiconductor devices is provided. The method includes forming a first liner and a first protective layer on top thereof, the first liner covering the first set of semiconductor devices; forming a second liner, the second liner having a first section covering the first protective layer, a transitional section, and a second section covering the second set of semiconductor devices, the second section being self-aligned to the first liner via the transitional section; forming a second protective layer on top of the second section of the second liner; removing the first section and at least part of the transitional section of the second liner; and obtaining the dual segment liner including the first liner, the transitional section and the second section of the second liner. A semiconductor structure with a self-aligned dual segment liner formed in accordance with one embodiment of the invention is also provided.

14 Claims, 14 Drawing Sheets

SELF-ALIGNED DUAL SEGMENT LINER AND METHOD OF MANUFACTURING THE SAME

FIELD OF THE INVENTION

The present invention relates to the field of semiconductor device manufacturing. In particular, it relates to a self-aligned dual segment liner and process of manufacturing the same.

BACKGROUND OF THE INVENTION

In the field of semiconductor device manufacturing, active semiconductor devices such as, for example, transistors are normally manufactured or fabricated by well-known front end of line (FEOL) technologies. Following the formation of active semiconductor devices such as transistors, stresses are normally induced into channel regions of the transistors through, for example, applying stress liners to improve performance. As is known in the art, in certain applications the stress liners may also function as etch-stop layers during a subsequent contact formation process.

A semiconductor chip or semiconductor structure may include different types of transistors. A transistor may be a field-effect-transistor (FET) such as, for example, a complementary metal-oxide-semiconductor (CMOS) FET, and may be the type of either a p-doped FET (PFET) or an n-doped FET (NFET). Different types of transistors may be manufactured on a same substrate of a semiconductor chip or structure.

As is well-known in the art, a compressive stress liner is normally applied to a PFET transistor and a tensile stress liner is normally applied to an NFET transistor. Both stress liners may be formed by a conventional dual stress liner (DSL) process. However, the conventional DSL process may create a transitional region or area, as shown in FIG. 1 below, where the two different types of liners overlap.

FIG. 1 is a simplified illustration of a dual stress liner formed by following a conventional DSL process. A semiconductor chip or semiconductor structure 10 may have two device regions 11 and 12 wherein two different types of transistors maybe manufactured. A first type of stress liner 21 may be formed to cover transistors in device region 11, and a second type of stress liner 23 may be formed to cover transistors in device region 12. Stress liners 21 and 23, which together forms the dual stress liner, may be nitride stress liners and may be compressive and/or tensile stress liners. Stress liner 21 may be covered by an oxide layer 22. In a transitional region or area 20, as is illustrated in FIG. 1, a portion of stress liner 21 and oxide layer 22 may be covered by stress liner 23. Transitional region 20 may form a tri-layer stack of nitride/oxide/nitride material, with a thickness that is thicker than either stress liner 21 or stress liner 23.

As is known in the art, differences in structure, as well in thickness, between the tri-layer stack of nitride/oxide/nitride in transitional region 20 and the single stress liners in device regions 11 and/or 12 may complicate an etching process in forming electric contacts for semiconductor structure 10. For example, when contacts of proper depth are formed through a single stress liner in a device region, contacts formed in transitional region 20 may not have sufficient depth, due to under-etching of the stack of nitride/oxide/nitride, to reach areas underneath that the contacts are intended for. On the other hand, creating contacts by etching through the stack of nitride/oxide/nitride in transitional region 20 may cause punch-through of contacts in gate, source, and/or drain areas of devices in a device region.

Therefore, there exists a need in the art to broaden the process window of forming contacts by minimizing, removing, and/or eliminating the stress liner overlap in transitional region 20 caused by a conventional DSL process. In other words, there is a need to tailor the structure and thickness of a dual stress liner in transitional region 20, where two different types of stress liners conjoins, such that a process of forming contacts for a semiconductor structure may be significantly simplified. In addition, there is also a need to simplify the current process of forming a dual stress liner.

BRIEF DESCRIPTION OF THE DRAWINGS

The present invention will be understood and appreciated more fully from the following detailed description of the invention, taken in conjunction with the accompanying drawings of which.

Figure 1:
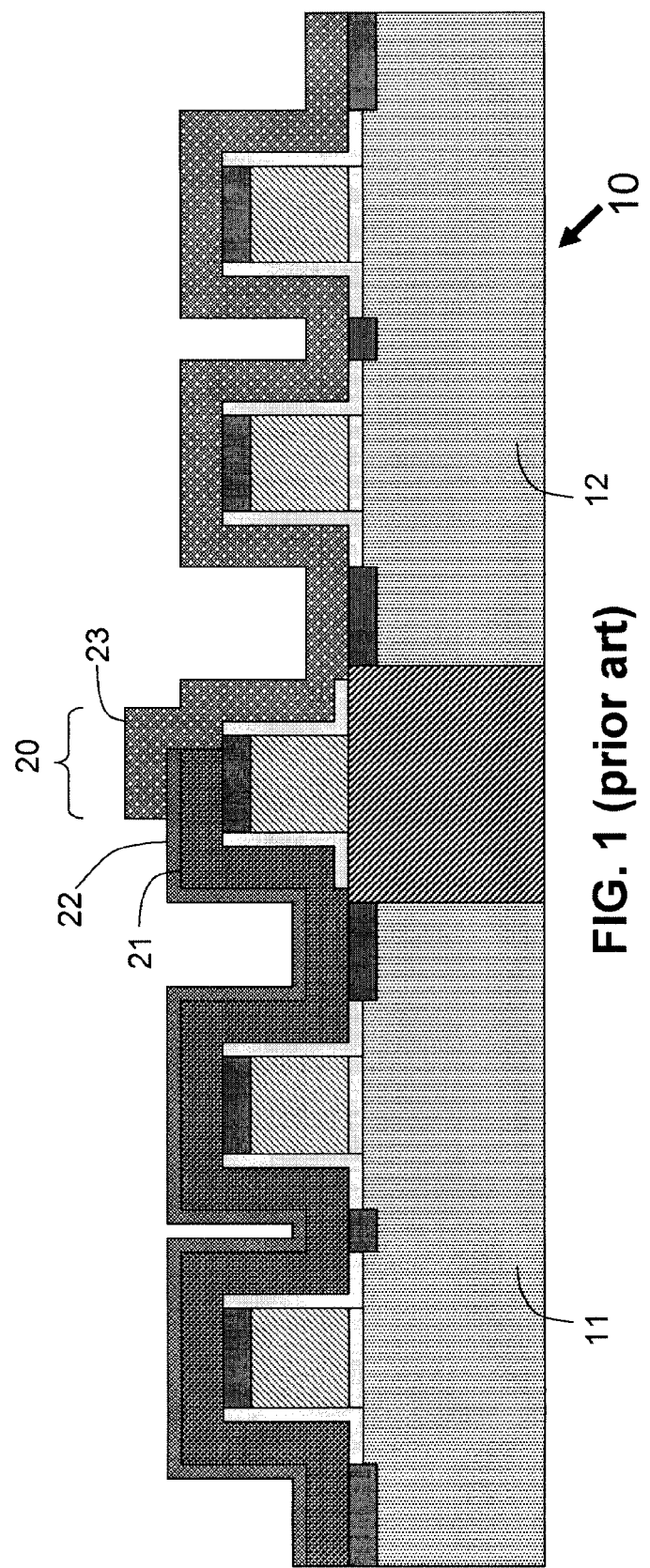
FIG. 1 is a simplified illustration of a conventional dual stress liner having a stack of stress liners in a transitional region.

It will be appreciated that for the purpose of simplicity and clarity of illustration, elements in the drawings have not necessarily been drawn to scale. For example, dimensions of some of the elements may be exaggerated relative to other elements for clarity purpose.

SUMMARY OF THE INVENTION

Embodiments of the present invention provide a semiconductor structure with a self-aligned dual segment liner, and method of making the same. For example, one embodiment of the invention provides a method of forming a dual segment liner covering a first and a second set of semiconductor devices. The method includes forming a first liner and a first protective layer on top thereof, the first liner covering the first set of semiconductor devices; forming a second liner, the second liner having a first section covering the first protective layer, a transitional section, and a second section covering the second set of semiconductor devices, the second section being self-aligned to the first liner via the transitional section; forming a second protective layer on top of the second section of second liner; removing the first section and at least part of the transitional section of the second liner; and obtaining the dual segment liner including the first liner, the transitional section and the second section of the second liner.

According to one embodiment, forming the second protective layer on top of the second section of the second liner includes depositing the second protective layer on top of the second liner; and recessing a top surface of the second protective layer to expose the first section and the transitional section of the second liner. According to one embodiment, recessing the top surface of the second protective layer includes applying a chemical-mechanical-polishing (CMP) process to remove the second protective layer on top of the first section and the transitional section of the second liner.

According to another embodiment, forming the first liner and the first protective layer on top thereof covering the first set of semiconductor devices includes forming the first liner that covers the first and second sets of semiconductor devices; forming the first protective layer on top of the first liner; and removing a portion of the first protective layer and a portion of the first liner to expose the second set of semiconductor devices.

According to one embodiment, removing the first section and at least part of the transitional section of the second liner includes applying a selective etching process to the first section and the transitional section of the second liner; monitoring a content level of exhaust gases from a the selective etching process; and continuing the selective etching process until the content level of the exhaust gases exhibits a drop. According to another embodiment, removing the first section and at least part of the transitional section of the second liner includes applying non-selectively etching the first section, the transitional section, and the second protective layer on top of the second section of said second liner; monitoring a content level of exhaust gases from the non-selective etching; and terminating the non-selective etching when the content level of exhaust gases exhibits a pre-determined pattern of change.

Embodiment of the invention also provides a semiconductor structure having a first and a second set of semiconductor devices fabricated on a semiconductor substrate. The semiconductor structure includes a first liner covering the first set of semiconductor devices; and a second liner covering the second set of semiconductor devices, wherein the first and the second liners are self-aligned to form a dual segment liner.

According to one embodiment, the first set of semiconductor devices are in a first device region, and the second set of semiconductor devices are in a second device region, and wherein the first and second liners are self-aligned outside the first and the second device regions. According to another embodiment, the first liner is a compressive stress liner and the second liner is a tensile stress liner.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In the interest of not obscuring presentation of essences and/or embodiments of the present invention, in the following detailed description, processing steps and/or operations that are well known in the art may have been combined together for presentation and/or for illustration purpose and in some instances may not have been described in detail. In other instances, processing steps and/or operations that are well known in the art may not be described at all. A person skilled in the art will appreciate that the following descriptions have rather focused on distinctive features and/or elements of embodiments of the present invention.

In semiconductor manufacturing industry, various types of active semiconductor devices such as transistors, including CMOS field-effect-transistors of NFETs and PFETs, may be created or formed on a single substrate of a semiconductor chip by applying FEOL processing technologies. Well-known FEOL technologies may include processing steps and/or operations of, for example, cap deposition, photo-resist-mask formation, photolithography, hard-mask formation, wet etching, reactive-ion etching (RIE), ion-implantation, and chemical-mechanical polishing (CMP), to list a few. After the formation of transistors, stress liners of the same or different types may be applied to the transistors, i.e., NFETs and PFETs, for device performance improvement. Improvement in device performance may come from improved mobility of electrons in a channel region of NFETs and/or holes in a channel region of PFETs brought by stresses induced by the stress liners.

Figure 2:
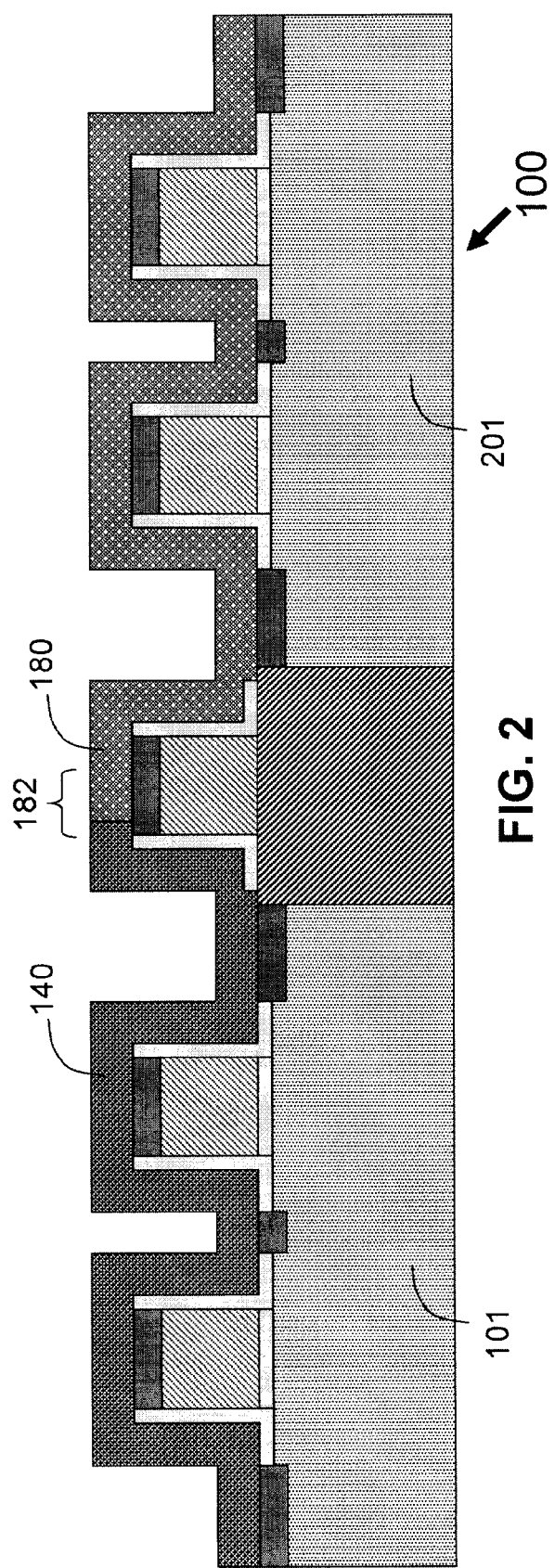
FIG. 2 is a simplified illustration of a self-aligned dual segment liner formed according to one embodiment of the present invention.

FIG. 2 is a simplified illustration of a self-aligned dual segment liner formed according to one embodiment of the present invention. A semiconductor chip or semiconductor structure 100 may include one or more device regions, for example device regions 101 and 201, which may be covered by a first liner 140 and a second liner 180 respectively. Liners 140 and 180 may together form the self-aligned dual segment liner. Furthermore, the self-aligned dual segment liner may be a portion of, or may form a part of, a multi-segment liner. Liners 140 and/or 180 may be nitride liners. However, the present invention is not limited in this respect and other liner materials may be used. Liners 140 and/or 180 may be stress liners or unstressed liners; may be compressive stress liners or tensile stress liners; may have the same or different types of stresses; and may have the same or different levels of stresses. When liner 140 and liner 180 are stress liners of different stress, the self-aligned dual segment liner may be a self-aligned dual stress liner (SADSL).

In the following description, liners 140 and 180 are assumed to be liners of different stresses and are referred to as stress liners 140 and 180. However, as is described above, stress liners 140 and/or 180 may not need to be stress liners. The self-aligned dual segment liner formed by stress liners 140 and 180 may be referred to as a self-aligned dual stress liner, or a SADSL. However, a person skilled in the art will appreciate that the assumption made here is simply for the ease of description.

As is shown in FIG. 2, stress liner 180 is self-aligned with stress liner 140. Likewise stress liner 140 is self-aligned with stress liner 180 and there is little or no overlap between stress liners 140 and 180 in a transitional region 182. This distinctive feature of the SADSL formed by stress liners 140 and 180 shall be easily appreciated when being compared with the conventional DSL shown in FIG. 1. A person skilled in the art will appreciate that the at least partial removal and/or complete elimination of stress liner overlap in transitional region 182, in contrary to that in a conventional DSL (FIG. 1), may significantly simplify a process of forming contacts in device regions 101 and 201 for transistors (110, 120, 210, and 220) and in an inter-connect region (310) of semiconductor structure 100 (FIG. 3).

FIGS. 3-14 are simplified illustrations of methods and/or processes of forming a self-aligned dual segment liner, or a self-aligned dual stress liner, in accordance with embodiments of the invention. According to one embodiment, a method may include forming a self-aligned dual stress liner on top of a first set of FETs, e.g., a set of NFETs, and a second set of FETs, e.g., a set of PFETs. However, a person skilled in the art will appreciate that the present invention is not limited in this respect and embodiments of a method may include forming a self-aligned dual stress liner on other semiconductor devices other than and in addition to transistors or FETs. Also, a person skilled in the art will appreciate that the present invention is not limited to stress liners, and may be used to form or manufacture other types of liners of two or more different types or properties, either stressed or unstressed. As used in this application, the term "set" may include one. For example, a set of FETs may include only one FET.

Figure 3:
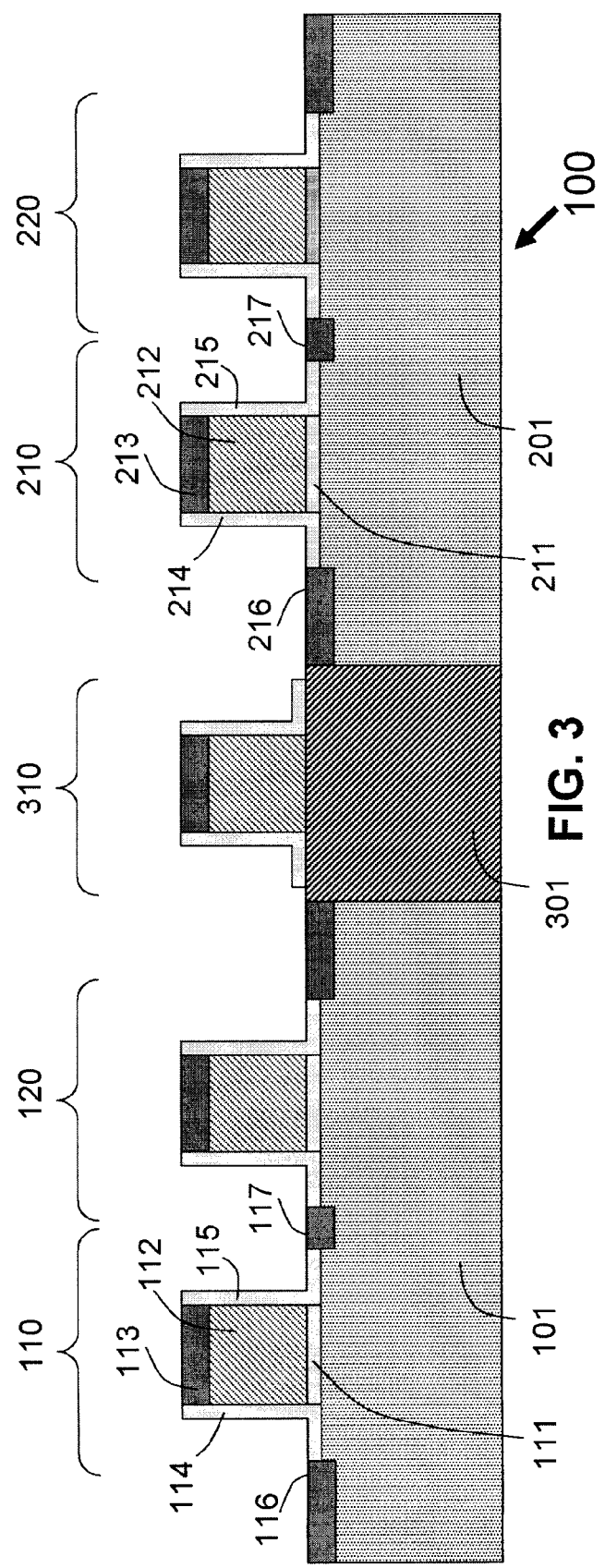
FIGS. 3-14 are simplified illustrations of methods and/or processes of forming a self-aligned dual segment liner according to one embodiment of the present invention.

FIG. 3 shows a semiconductor structure (chip) 100 that includes, among others, a combination of transistors such as NFETs and PFETs. For example, structure 100 may include an NFET 110 having a gate electrode 112 formed on top of a gate dielectric 111. At the sides of gate electrode 112 there may be formed spacers 114 and 115, which may be nitride spacers with reduced width. During a process of forming NFET 110, silicidation may be conducted forming conductive silicide layers over its source, drain, and gate regions, as shown in FIG. 3. For example, source and drain regions of NFET 110 may be covered by silicide layers 116 and 117, and gate electrode 112 may be covered by silicide layer 113. Moreover, a person skilled in the art will appreciate that structure (chip) 100 may include one or more other NFETs, for example a NFET 120, having similar gate structures as NFET 110. NFETs 110 and 120 may be created or formed on top of a p-doped device region 101.

FIG. 3 also illustrates that structure (chip) 100 may include a PFET 210 having a gate electrode 212 formed on top of a gate dielectric 211 with spacers 214 and 215 formed at the sides of gate electrode 212. During a process of forming PFET 210, silicidation may be conducted forming conductive silicide layers over its source, drain, and gate regions, as shown in FIG. 3. For example, source and drain regions of PFET 210 may be covered by silicide layers 216 and 217, and gate electrode 212 may be covered by silicide layer 213. Moreover, a person skilled in the art will appreciate that structure (chip) 100 may include one or more other PFETs, for example a PFET 220, having similar gate structures as PFET 220. PFETs 210 and 220 may be created or formed on top of an n-doped device region 201.

As illustrated in FIG. 3, structure (chip) 100 may further include one or more inter-connect structures, such as a structure 310, which may be formed on top of an insulated region such as, for example a shallow trench insulation (STI) region 301. Inter-connect structure 310 may be used in connecting electrically adjacent FETs or other active devices.

Semiconductor structure 100 as shown in FIG. 3, including NFETs 110 and 120, PFETs 211 and 221, and inter-connect structure 310, may be formed by applying any well-known FEOL processes. Details of steps and/or operations of the FEOL processes are not described here in order not to obscure the presentation of essence of the present invention.

After silicidation of source, drain and gate regions thereof, semiconductor devices, i.e., NFETs 110 and 120, PFETs 210 and 220, and inter-connect 310, may be covered by a self-aligned dual stress liner (SADSL). A process of forming the SADSL, according to one embodiment of the invention as described below in detail, may be applied to any other combinations of NFET and/or PFET transistors; and/or any other number of NFET and/or PFET transistors; and/or any other suitable surface topologies of semiconductor devices or structures.

Figure 4:
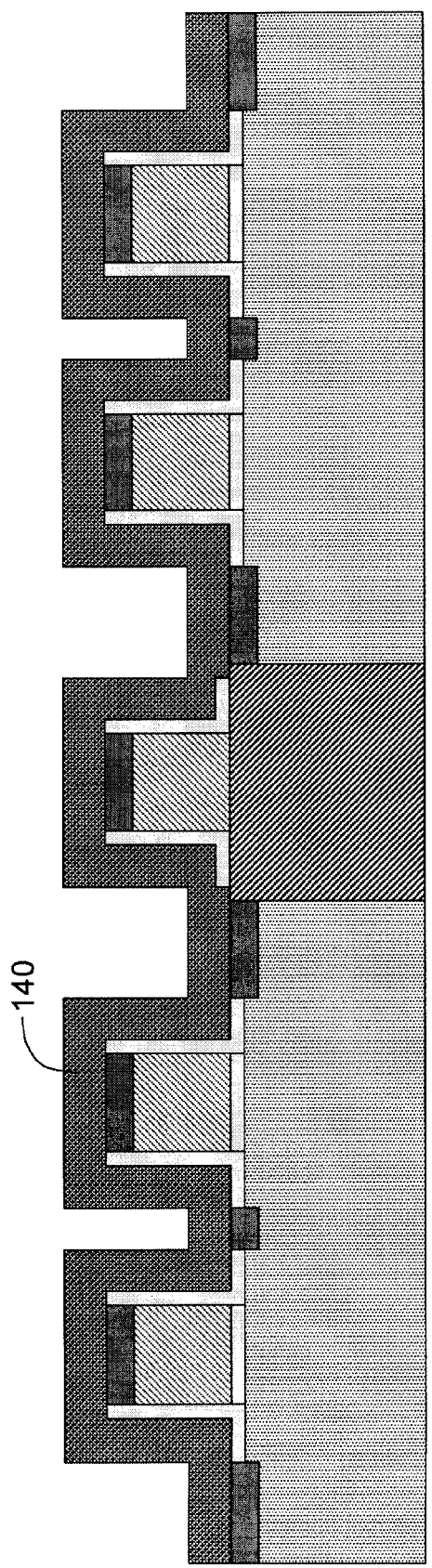

FIG. 4 illustrates that, according to one embodiment, a method may include forming a first liner 140 through a well-known process such as, for example, deposition on top of semiconductor structure 100. First liner 140 may cover the most surface of structure (chip) 100, including at least NFETs 110 and 120, PFETs 210 and 220, and inter-connect 310. First liner 140 may be a layer of tensile nitride. However, a person skilled in the art will appreciate that the present invention is not limited in this respect. For example, first liner 140 may be a layer of compressive nitride or a liner without stress.

According to one embodiment, if first liner 140 is a tensile nitride layer, a method may include removing and replacing a portion of tensile nitride layer 140, i.e., the portion on top of PFETs 210 and 220, later with a second liner 180 (FIG. 2) of compressive nitride. According to another embodiment, if first liner 140 is a compressive nitride layer, a method may include removing and replacing a portion of compressive nitride layer 140, i.e., the portion on top of NFETs 110 and 120, later with a second liner of tensile nitride liner (not shown). Hereinafter, for the purpose of description, first liner 140 is assumed to be a tensile nitride layer. Tensile nitride layer 140 may have a thickness ranging from around 500 Å to around 900 Å, and preferably around 600 Å. However, the invention is not limited in this respect either, and other thicknesses, below 500 Å or above 900 Å, of tensile nitride layer 140 may be used to accommodate different design needs such as, for example, a particular requirement of stress level to be induced into channel regions of NFETs 110 and 120.

Figure 5:
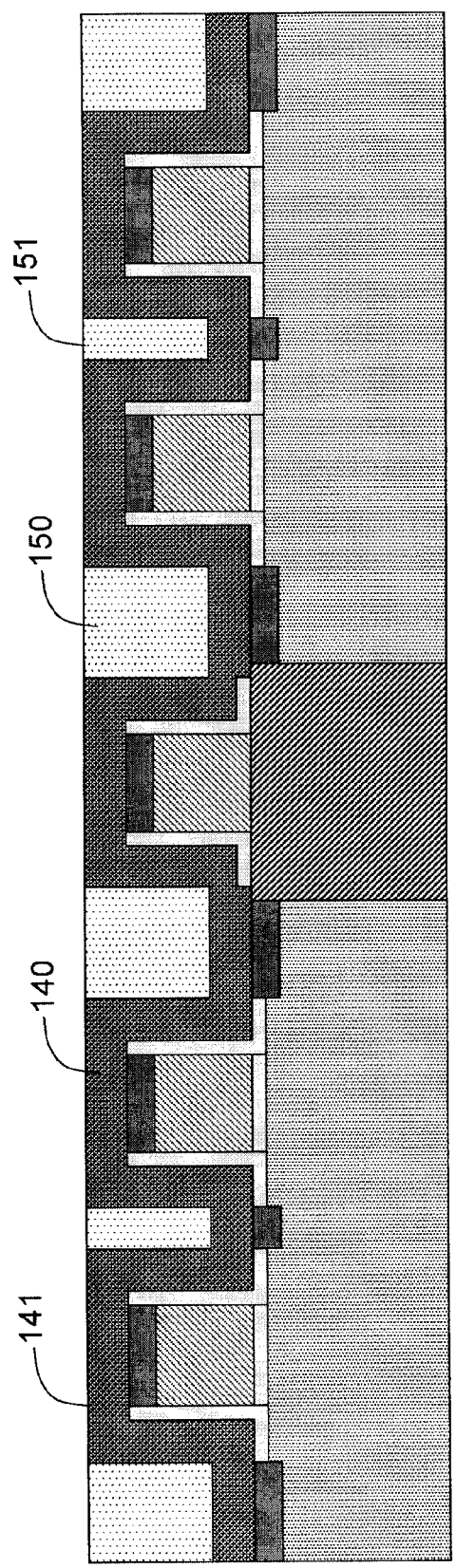
Figure 6:
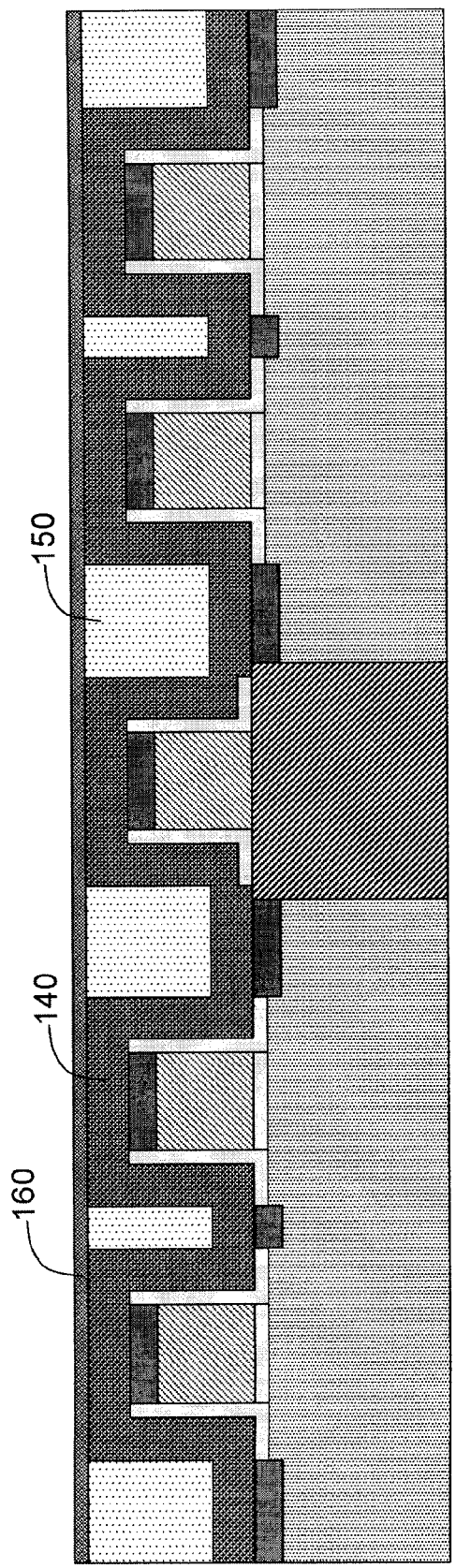

FIG. 5 illustrates that after forming first stress liner 140, one embodiment of a method may include forming a layer of oxide 150 covering a top surface 141 of first stress liner 140. Oxide layer 150 may be deposited through, for example, a sub-atmospheric chemical vapor deposition (SACVD) process although other well-known processes and/or techniques may be used as well. Embodiment of a method may also include subsequently planarizing oxide layer 150 such that a top surface 151 of oxide layer 150 becomes co-planner with top surface 141 of first stress liner 140. However, according to another embodiment, oxide layer 150 may be planarized to have a suitable thickness above, rather than co-planner with, first stress liner 140 and thus may perform at least partially the function of a protective layer 160 (FIG. 6). The planarization of oxide layer 150 may be performed through a well-known chemical-mechanical-polishing (CMP) process, preferably a fixed abrasive CMP process, but the invention is not limited in this respect and other planarization process may be used. The CMP process may be controlled and/or terminated by utilizing the selectivity of oxide 150, relative to nitride stress liner 140, during the process of planarization.

Figure 10:
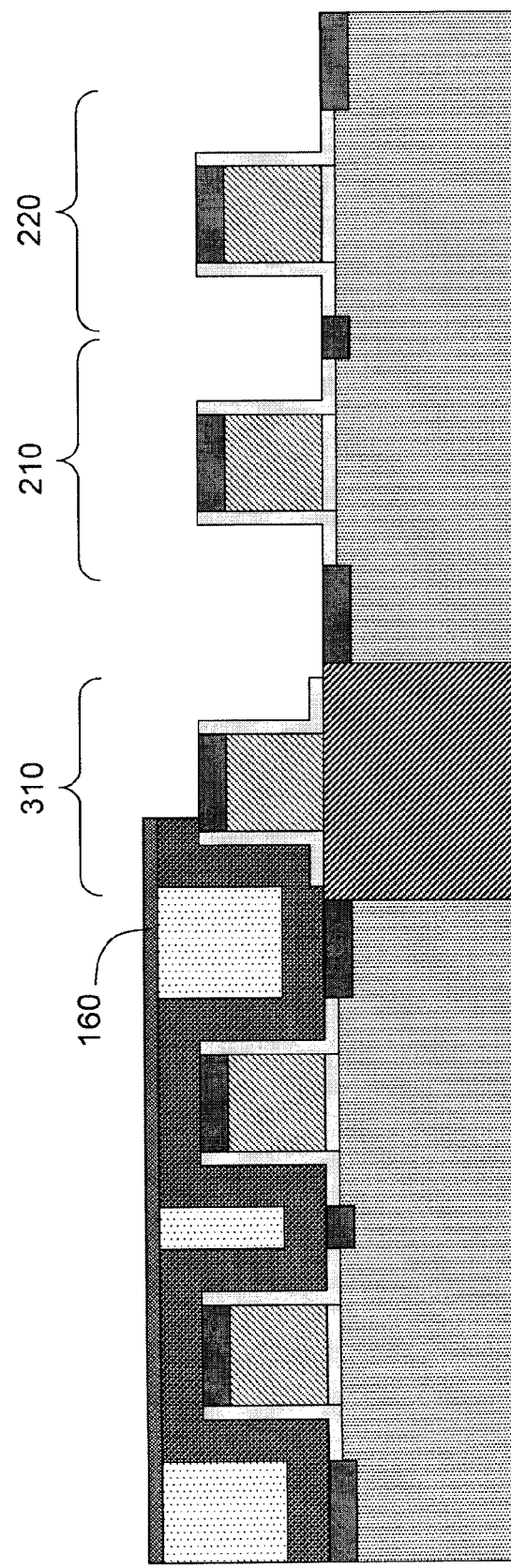

FIG. 6 illustrates that after planarizing oxide layer 150 to have a co-planner surface 151 with first stress liner 140, one embodiment of a method may include depositing a protective layer 160, which may be a low-temperature oxide (LTO) layer, to cover first stress liner 140 and oxide layer 150. Protective layer 160 may be referred to as a cap layer, a cap oxide layer, or an etch-stop layer, and may protect first stress liner 140 underneath during a subsequent RIE process (FIG. 10). Cap oxide layer 160 may have a thickness of around 150 Å. However, the present invention is not limited in this respect and other thicknesses of cap oxide layer 160, for example from 100 Å to 300 Å or a thickness suitable as an etch-stop layer and/or hard-mask layer may be used.

Figure 7:
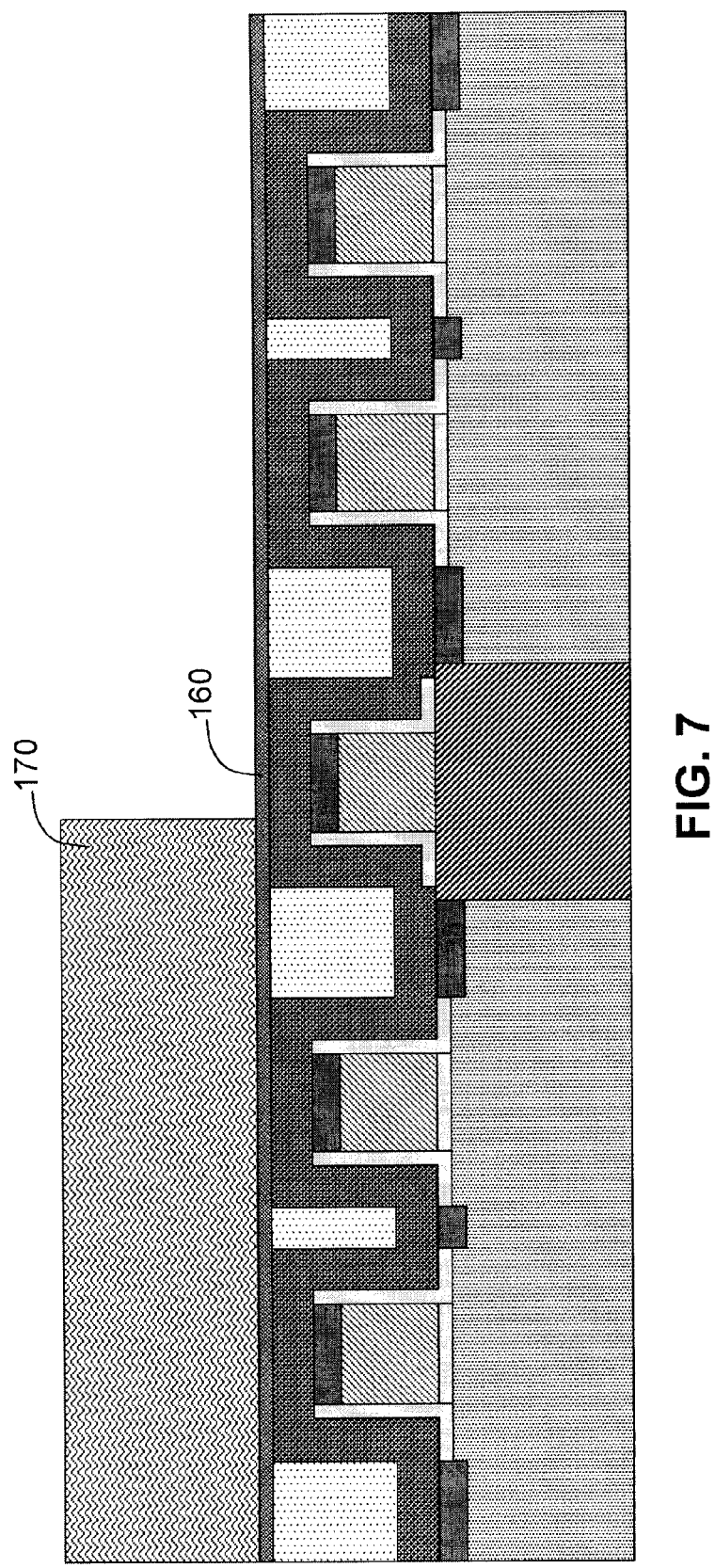

FIG. 7 illustrates that one embodiment of a method may include forming a layer of photo-resist material through, for example, a well-known spin-on process, on top of cap oxide layer 160. The photo-resist material may be subsequently patterned by, for example, applying a photo-lithography technique, to create a photo-mask 170. Photo-mask 170 and/or cap oxide layer 160 may cover device region 101 to protect NFETs 110 and 120 during a subsequent etching process of oxide. It shall be noted that a person skilled in the art will appreciate that protective layers of other materials, other than photo-resist and oxide, may be used as well to provide adequate protection for device region 101 of NFETs 110 and 120. In addition, a person skilled in the art will also appreciate that an anti-reflection-coating (ARC) may be applied on top of cap oxide layer 160, prior to the spin-on of photo-resist material, to improve the precision control of photo-mask patterning.

As described above with reference to FIG. 4, it shall also be noted that when first stress liner 140 is a compressive nitride layer, one embodiment of a method may include creating a photo-mask that covers and therefore protects device region 201 of PFETs 210 and 220, instead of device region 101 of NFETs 110 and 120. According to another embodiment, photo-mask 170 may cover at least a portion of inter-connect structure 310 where first stress liner 140 is self-aligned to second stress liner 180.

Figure 8:
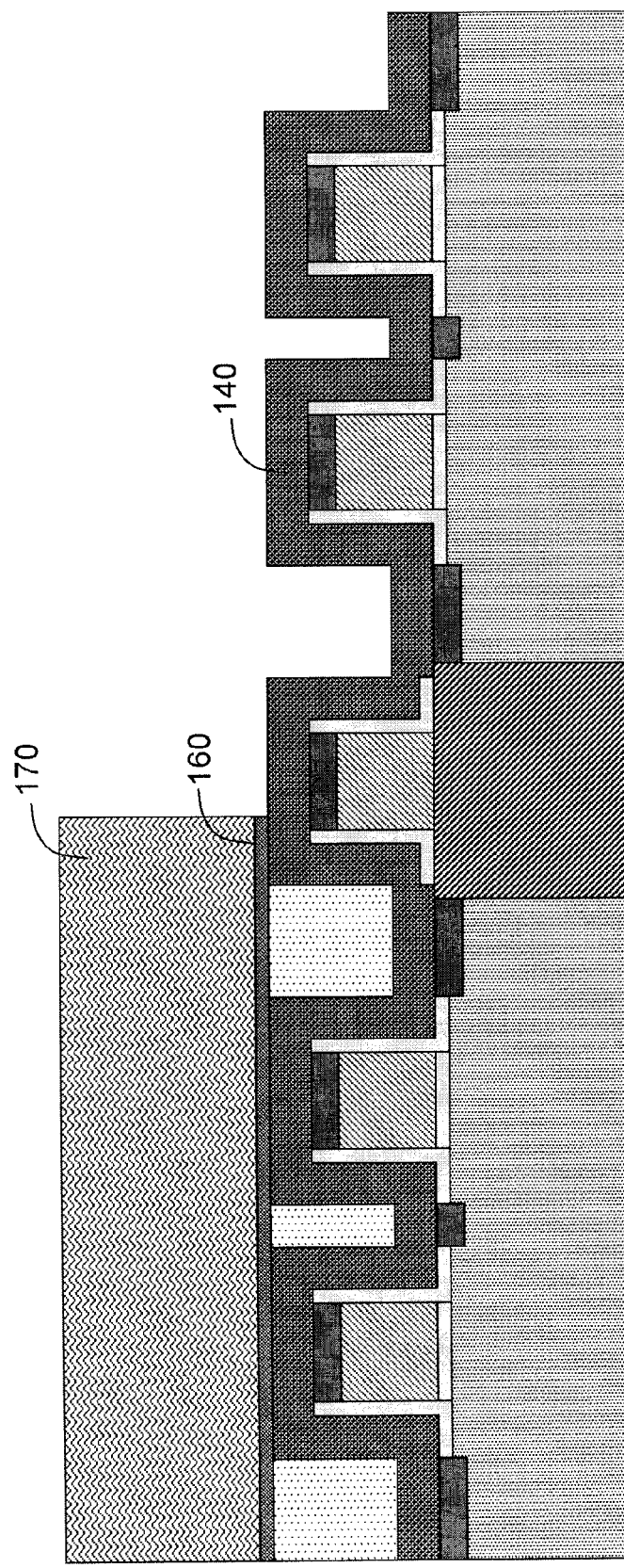

FIG. 8 illustrates that following forming photo-mask 170, one embodiment of a method may include removing cap oxide layer 160 and oxide layer 150, which cover device region 201 of PFETs 210 and 220 and are not covered by photo-mask 170, through for example an etching process. The etching process may be any well-known etching processes such as, for example, a reactive-ion-etching (RIE) process that are selective (non-reactive) to nitride. The selectivity of etching may be achieved by applying a mixture of gases such as, for example, $C_4F_8$, $O_2$, Ar, and/or other suitable $C_xF_y$ chemistry and by adjusting RF power and bias used in the etching process. The RIE process may be monitored and promptly terminated upon detection of a dramatic change in the content mixture of exhaust gases coming out of a chamber wherein the RIE is conducted. Such dramatic change in content mixture of exhaust gases may be an indication that at least most part of first stress liner 140 covering PFETs 210 and 220 may have been exposed.

Figure 9:
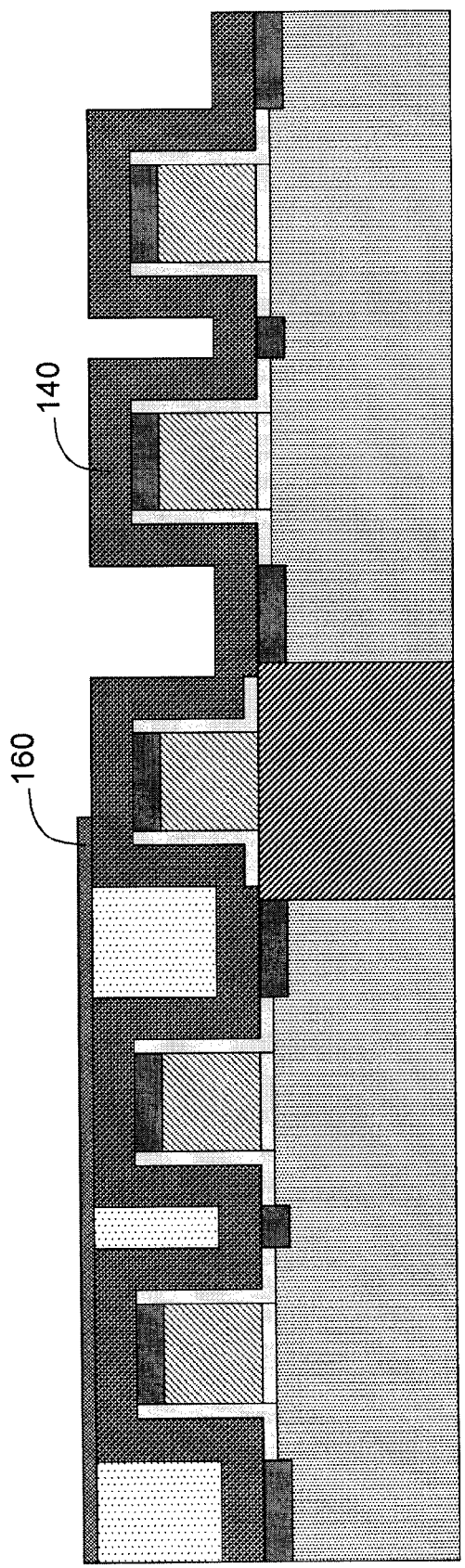

FIGS. 9 and 10 illustrate that after RIE of cap oxide layer 160 and oxide layer 150, according to one embodiment, a method may include stripping off photo-mask 170 so that cap oxide layer 160 is exposed. Next, according to another embodiment, a method may include removing the exposed portion of first stress liner 140 of tensile nitride by applying cap oxide layer 160 as a protective layer or hard-mask. The removing process may be an etching process, such as a RIE process, that is designed to be selective (non-reactive) to oxide to expose PFETs 210 and 220 underneath. The selectivity of etching may be achieved by applying a mixture of gases such as, for example, $CH_3F$, $CH_2F_2$, $CHF_3$, $CF_4$, Ar, $O_2$, CO, and/or other suitable $CH_xF_y$ chemistry, and by adjusting RF power and bias used in the etching process. According to yet another embodiment, the exposed portion of first stress liner 140 may be removed before photo-mask 170 is stripped off, and thus photo-mask 170 may be used, at least partially, as a hard-mask in the RIE process of first stress liner 140. Following the removal of the exposed portion of first stress liner 140, cap oxide layer 160 may be optionally removed by applying a selective RIE process.

Figure 11:
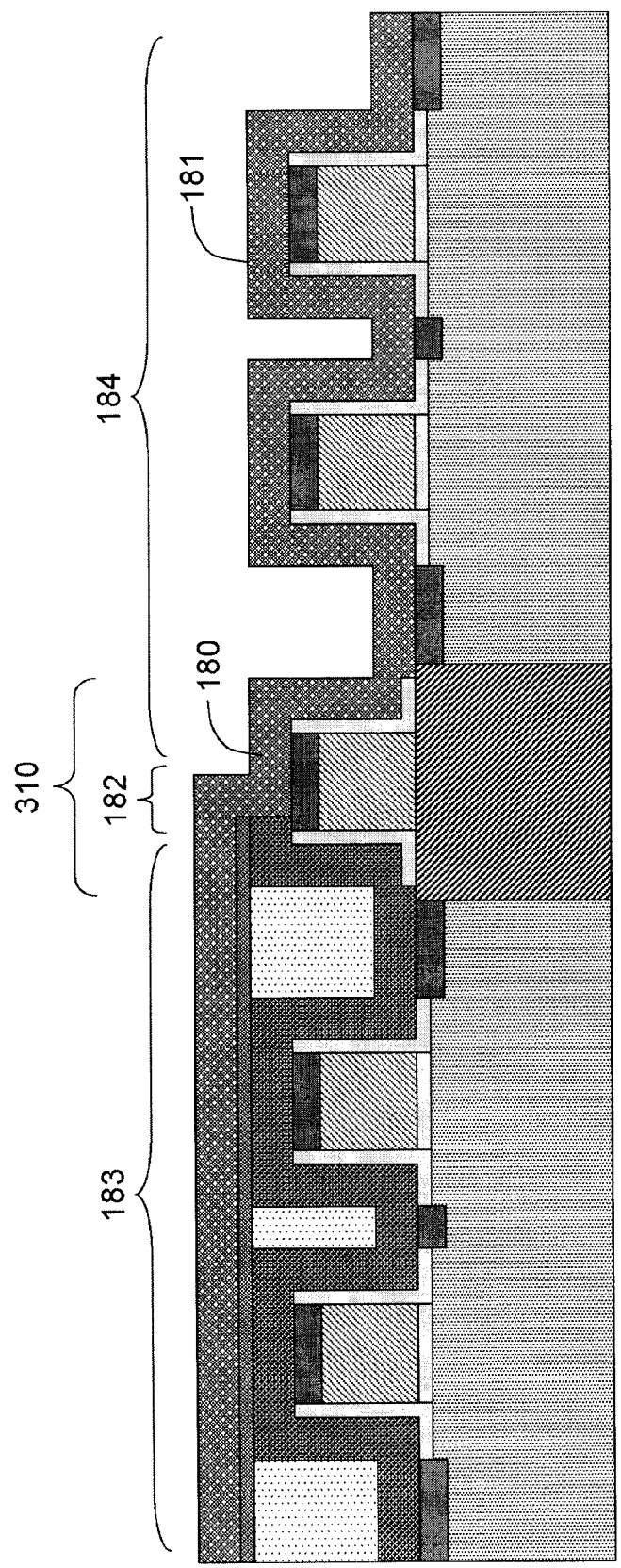

Turning now to FIG. 11, one embodiment of a method may include depositing a second liner 180 following the exposure of PFETs 210 and 220 after etching away the exposed portion of first stress liner 140, as shown in FIG. 10. Second liner 180 may be a layer of compressive nitride liner 180 that is suitable for PFETs 210 and 220. Stress liner 180 may include a first section 183 on top of cap oxide layer 160, a second section 184 on top of PFETs 210 and 220, and a transitional section 182 between the first and second sections. Stress liner 180 may have a thickness ranging from around 500 Å to around 700 Å, and preferably around 600 Å. However, the invention is not limited in this respect and other thicknesses, below 500 Å or above 700 Å, may be used to accommodate different design needs such as, for example, a particular requirement of stress level to be induced into channel regions of PFET 210 and 220. It is clear from FIG. 11 that, according to embodiments of the invention, the second section 184 of compressive stress liner 180, on top of PFETs 210 and 220, may be self-aligned with the tensile stress liner 140, under cap oxide layer 160, through transitional section 182. Transitional section 182 may be formed on top of inter-connect structure 310. However, the invention is not limited in this respect and transitional section 182 may be formed on any other areas by design, normally from active semiconductor devices such as away from devices 110, 120, 210, and 220 (FIG. 3). For example, transitional section 182 may be formed (not shown) directly on top of a shallow trench region (STI).

Figure 12:
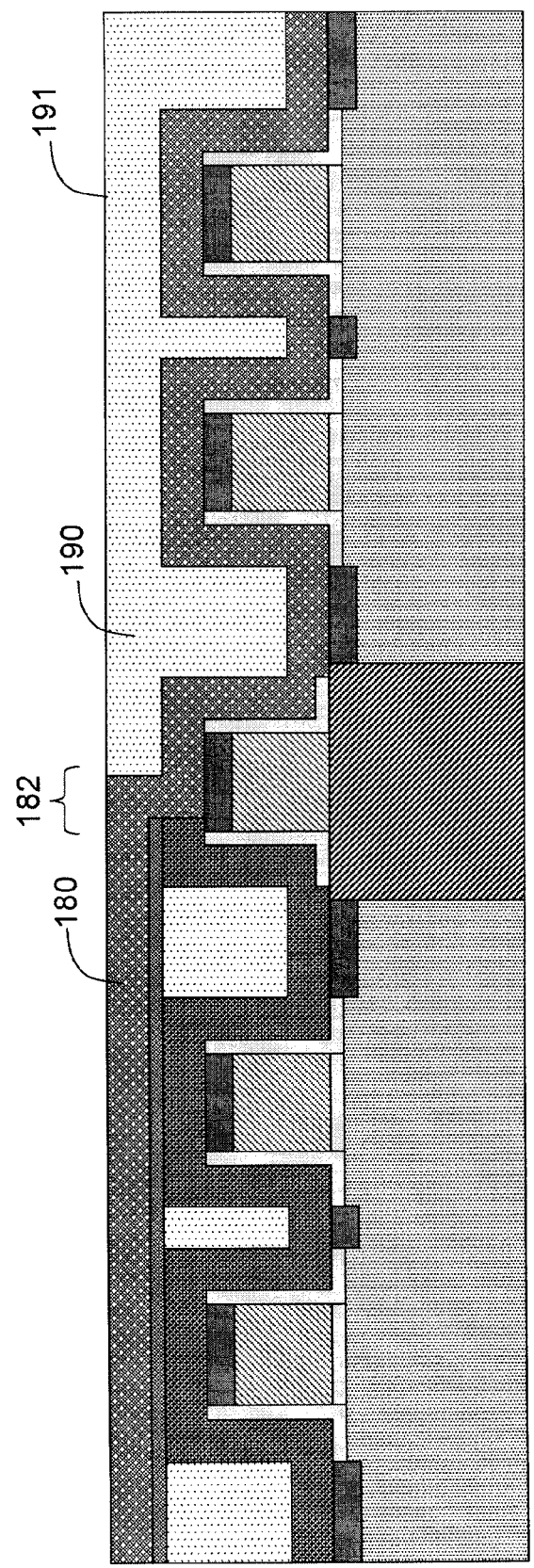

FIG. 12 illustrates that, following depositing stress liner 180, one embodiment of a method may include forming a protective layer 190, such as oxide, to cover the top surface of stress liner 180 across device regions 101 and 201. However, materials other than oxide that is selective to stress liner 180 may be used. The formation of protective layer 190 may be through a well-known process such as, for example, a SACVD process. Next, one embodiment of a method may include recessing protective layer 190 such that a top surface 191 of protective layer 190 of oxide becomes co-planner with the top surface of first section 183 of stress liner 180, which is on top of cap oxide layer 160 covering NFETs 110 and 120. The recessing of protective layer 190 may be performed through a planarization process such as a well-known chemical-mechanical-polishing (CMP) process, preferably a fixed abrasive CMP process. However the invention is not limited in this respect and other planarization processes or recessing processes may be used. The CMP process may apply the selectivity of oxide of protective layer 190, relative to stress liner 180, to stop at the top surface of first section 183 of stress liner 180.

Figure 14:
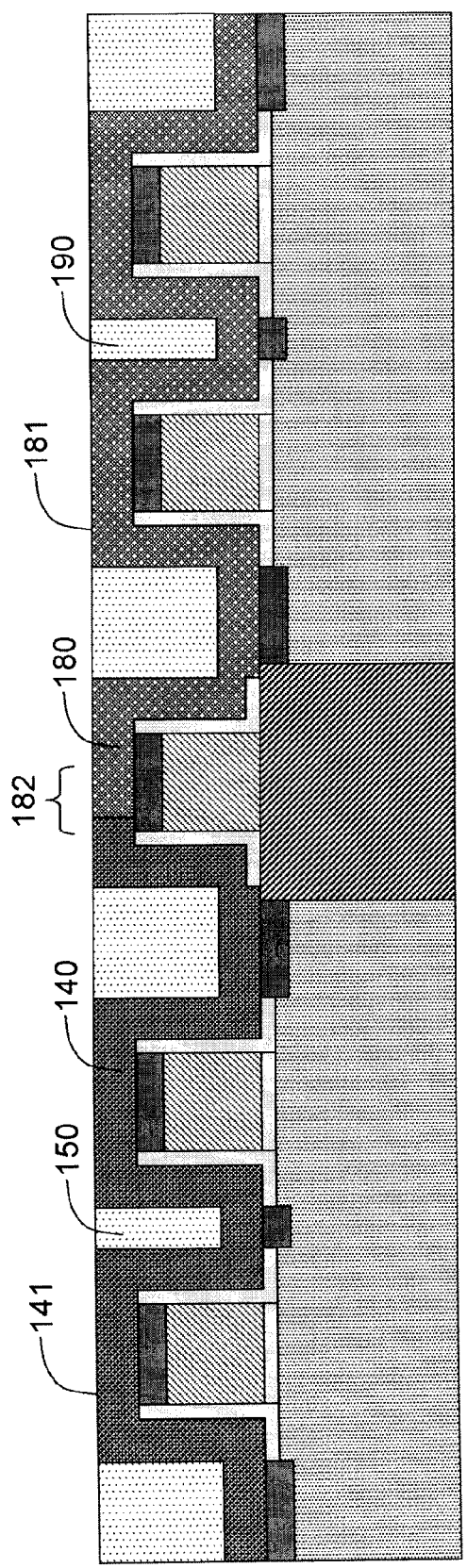

According to another embodiment, following the step of forming protective layer 190, one embodiment of a method may include optionally planarizing protective layer 190, if needed, to create a relatively flat top surface, then performing non-selective etching to expose the top surface of first section 183 of stress liner 180 as shown in FIG. 12, and continuing performing the non-selective etching until a top surface 141 of stress liner 140 and a top surface 181 of stress liner 180 are exposed, as shown in FIG. 14. The non-selective etching may be controlled, as is well known in the art, by timing, and/or by monitoring content levels of exhaust gases from the etching process until the level of a particular content such as, for example, $N_2$ and/or $O_2$ exhibits a pre-determined pattern of change such as a drop or an increase, at that point the non-selective etching process may be terminated.

Figure 13:
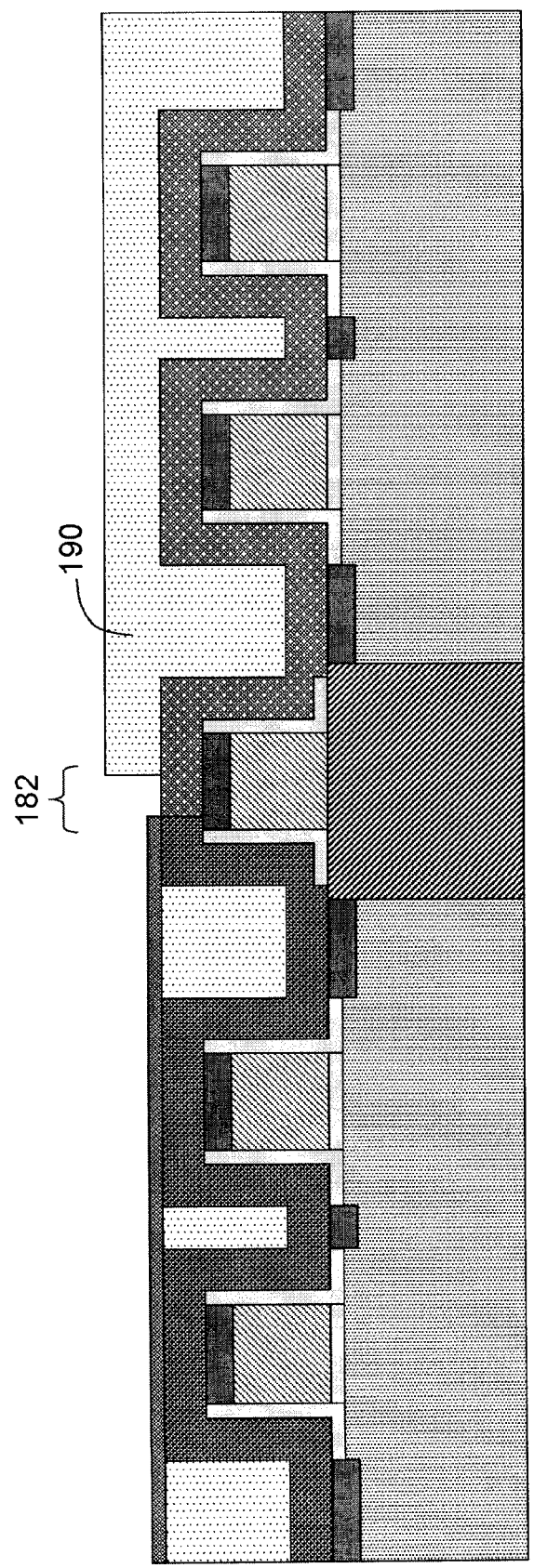

FIG. 13 illustrates that following the planarizaiton of protective layer 190, one embodiment of a method may include removing and/or etching away the exposed first section 183 of stress liner 180, which is a compressive stress liner undesirable for NFETs 110 and 120 in device region 101. Oxide protective layer 190 may protect the second section 184 of stress liner 180 during the etching process of first section 183 of stress liner 180.

The etching process may be a RIE process and may be end-pointed through monitoring content of exhaust gases from the RIE process. Upon detection of a drop, which may be relatively sharp or even dramatic, in the content of nitride, the RIE process may be promptly stopped or terminated. This is because a sharp drop in the nitride content may be an indication that at least most of the exposed nitride liner 180 (first section 183), on top of cap oxide layer 160, may have been etched away. According to one embodiment of the invention, the RIE process shall be stopped or terminated promptly once the exposed stress liner 180 above the NFET device region 101 is etched away such as not to over-etch the stress liner 180 in transitional section 182. One embodiment of a method may include timing the RIE process such that a predetermined thickness of nitride, approximately equal to or less than that of cap oxide layer 160, may be removed to make nitride stress liner 180 at transitional section 182 have approximately the same thickness as the rest of nitride stress liner 180. First stress liner 140 together with both transitional section 182 and second section 184 of second stress liner 180 form a self-aligned dual stress liner (SADSL).

FIG. 14 further illustrates that after removing first section 183 of compressive stress liner 180 in NFET device region 101, one embodiment of a method may include optionally planarizing oxide layer 190 to be approximately co-plannar with top surface 141 of tensile stress liner 140 and top surface 181 of compressive stress liner 180. The co-planner surface may be prepared to form subsequent inter-connect structures thereupon. Processes used in the planarization may be any well-known processes such as, for example, a CMP process. Alternatively, according to yet another embodiment, oxide protective layer 160, oxide layer 150, and oxide protective layer 190 may be selectively (relative to nitride stress liner 140 and 180) etched away, for example, by applying a RIE process as described above to form semiconductor structure (chip) 100 as shown in FIG. 2.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of forming a dual segment liner covering a first and a second set of semiconductor devices on a single substrate, the method comprising:
    forming a first liner covering said first set of semiconductor devices and a first protective layer on top of said first liner, said first protective layer having a flat top surface;
    forming a second liner, said second liner having a first section covering said first protective layer, a transitional section on top of an inter-connect structure, and a second section covering said second set of semiconductor devices, said second section being self-aligned to said first liner via said transitional section;
    forming a second protective layer on top of said second section of said second liner;
    removing said first section and at least a portion of said transitional section of said second liner;
    planarizing said second protective layer to be co-planar with at least one of said first and said second liners; and
    obtaining said dual segment liner including said first liner, at least a part of said transitional section and said second section of said second liner.

2. The method of claim 1, wherein forming said second protective layer on top of said second section of said second liner comprises:
    depositing said second protective layer on top of said second liner; and
    recessing a top surface of said second protective layer to expose said first section and said transitional section of said second liner.

3. The method of claim 2, wherein recessing said top surface of said second protective layer comprises applying a chemical-mechanical-polishing (CMP) process to remove said second protective layer on top of said first section and said transitional section of said second liner.

4. The method of claim 1, wherein forming said first protective layer on top of said first liner comprises:
    depositing a layer of dielectric material on top of said first liner;
    planarizing a top surface of said layer of dielectric material; and
    depositing said first protective layer on top of said layer of dielectric material.

5. The method of claim 4, wherein planarizing said top surface of said dielectric material comprises applying a chemical-mechanical-polishing (CMP) process to recess said top surface of said dielectric material to be co-planar with said first liner.

6. The method of claim 1, wherein removing said first section and at least a portion of said transitional section of said second liner comprises:
    selectively etching said first section and said transitional section of said second liner;
    monitoring a content level of exhaust gases from said selective etching; and
    continuing said selective etching until said content level of said exhaust gases exhibits a change.

7. The method of claim 6, comprising continuing said selective etching for a pre-determined time period after said content level exhibits said drop, to remove at least a portion of said transitional section of said second liner that is less than, and preferably equal to, the thickness of said first protective layer.

8. The method of claim 7, wherein said selective etching comprises applying a reactive-ion-etching (RIE) process using a mixture of gases to remove said first section and said at least a portion of said transitional section of said second liner, said mixture of gases including one or more of $CH_3F$, $CH_2F_2$, $CHF_3$, $CF_4$, $O_2$, CO, and Ar.

9. A method of forming a dual segment liner covering a first and a second set of semiconductor devices on a single substrate, the method comprising:
    forming a first liner covering said first set of semiconductor devices and a first protective layer on top of said first liner, said first protective layer having a flat top surface;
    forming a second liner, said second liner having a first section covering said first protective layer, a transitional section on top of an inter-connect structure, and a second section covering said second set of semiconductor devices, said second section being self-aligned to said first liner via said transitional section;
    forming a second protective layer on top of said second liner;
    removing said first section and at least a portion of said transitional section of said second liner;
    planarizing said second protective layer to be co-planar with at least one of said first and said second liners; and
    obtaining said dual segment liner including said first liner, at least a part of said transitional section and said second section of said second liner.

10. The method of claim 9, wherein removing said first section and said at least a portion of said transitional section of said second liner comprises:
    recessing said second protective layer to expose said first section and said transitional section of said second liner;
    non-selectively etching said first section and said transitional section of said second liner, and said second protective layer on top of said second section of said second liner;
    monitoring a content level of exhaust gases from said non-selective etching; and
    terminating said non-selective etching when said content level exhibits a pattern of change.

11. The method of claim 9, wherein forming said first liner covering said first set of semiconductor devices and said first protective layer on top of said first liner comprises:
    forming said first liner covering said first and second sets of semiconductor devices;
    forming said first protective layer on top of said first liner; and removing a portion of said first protective layer and a portion of said first liner to expose said second set of semiconductor devices.

12. The method of claim 11, wherein forming said first protective layer comprises depositing said first protective layer to have a thickness between about 50 nm and about 1000 nm above a top surface of said first liner.

13. The method of claim 11, wherein removing said portion of said first protective layer comprises applying a reactive-ion-etching (RIE) process using a mixture of gases including one or more of $C_4F_6$, $C_4F_8$, $C_5F_8$, $O_2$, and Ar.

14. The method of claim 11, wherein removing said portion of said first liner comprises applying a reactive-ion-etching (RIE) process using a mixture of gases including one or more of $CH_3F$, $CH_2F_2$, $CHF_3$, $CF_4$, $O_2$, CO, and Ar.

* * * * *